(12) United States Patent
Lin et al.

(10) Patent No.: US 9,698,135 B2
(45) Date of Patent: Jul. 4, 2017

(54) MECHANISMS FOR FORMING PACKAGE STRUCTURE

(71) Applicant: Taiwan Semiconductor Manufacturing Co., Ltd, Hsinchu (TW)

(72) Inventors: Jing-Cheng Lin, HsinChu County (TW); Po-Hao Tsai, Zhongli (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/990,012

(22) Filed: Jan. 7, 2016

(65) Prior Publication Data

US 2016/0118372 A1    Apr. 28, 2016

Related U.S. Application Data

(62) Division of application No. 14/087,466, filed on Nov. 22, 2013, now Pat. No. 9,252,065.

(51) Int. Cl.
*H01L 21/44* (2006.01)
*H01L 25/00* (2006.01)
(Continued)

(52) U.S. Cl.
CPC .......... *H01L 25/50* (2013.01); *H01L 21/4875* (2013.01); *H01L 21/561* (2013.01); *H01L 21/565* (2013.01); *H01L 23/3107* (2013.01); *H01L 23/481* (2013.01); *H01L 24/02* (2013.01); *H01L 24/19* (2013.01); *H01L 24/97* (2013.01); *H01L 25/105* (2013.01); *H01L 23/3128* (2013.01); *H01L 24/73* (2013.01); *H01L 2224/02372* (2013.01);
(Continued)

(58) Field of Classification Search
CPC . H01L 21/4875; H01L 21/561; H01L 21/565; H01L 23/3107; H01L 23/481; H01L 24/02; H01L 24/97; H01L 25/50
USPC .......................................................... 438/667
See application file for complete search history.

(56) References Cited

U.S. PATENT DOCUMENTS

| | | | |
|---|---|---|---|
| 7,838,337 B2 | 11/2010 | Marimuthu et al. | |
| 7,989,270 B2 * | 8/2011 | Huang ................... | H01L 23/50 438/127 |

(Continued)

FOREIGN PATENT DOCUMENTS

CN    102760713 A    10/2012

OTHER PUBLICATIONS

Chinese language office action dated Feb. 14, 2017, issued in application No. CN 201410436288.7.

*Primary Examiner* — Luan C Thai
(74) *Attorney, Agent, or Firm* — McClure, Qualey & Rodack, LLP

(57) ABSTRACT

A method for forming a package structure is provided. The method includes forming a plurality of conductive columns over a carrier substrate and forming an interfacial layer over sidewalls and tops of the conductive columns. The method also includes disposing a semiconductor die over a planar portion of the interfacial layer. The method further includes forming a molding compound to partially or completely encapsulate the semiconductor die, the conductive columns, and the interfacial layer such that the molding compound is in direct contact with the interfacial layer.

20 Claims, 14 Drawing Sheets

(51) Int. Cl.
*H01L 23/48* (2006.01)
*H01L 23/31* (2006.01)
*H01L 23/00* (2006.01)
*H01L 25/10* (2006.01)
*H01L 21/56* (2006.01)
*H01L 21/48* (2006.01)

(52) U.S. Cl.
CPC ........... *H01L 2224/12105* (2013.01); *H01L 2224/13147* (2013.01); *H01L 2224/16225* (2013.01); *H01L 2224/16237* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/73267* (2013.01); *H01L 2224/8181* (2013.01); *H01L 2224/81815* (2013.01); *H01L 2224/83005* (2013.01); *H01L 2224/83192* (2013.01); *H01L 2224/83365* (2013.01); *H01L 2224/97* (2013.01); *H01L 2225/0651* (2013.01); *H01L 2225/06568* (2013.01); *H01L 2225/1035* (2013.01); *H01L 2225/1058* (2013.01); *H01L 2924/12042* (2013.01); *H01L 2924/13091* (2013.01); *H01L 2924/15311* (2013.01); *H01L 2924/16152* (2013.01); *H01L 2924/181* (2013.01)

(56) References Cited

U.S. PATENT DOCUMENTS

| | | | |
|---|---|---|---|
| 8,133,762 B2 * | 3/2012 | Pagaila | H01L 21/568 257/741 |
| 8,866,287 B2 * | 10/2014 | Teh | H01L 21/568 257/700 |
| 8,941,222 B2 | 1/2015 | Hunt | |
| 2011/0233754 A1 | 9/2011 | Meyer-Berg | |
| 2014/0131858 A1 * | 5/2014 | Pan | H01L 24/19 257/737 |
| 2014/0175663 A1 | 6/2014 | Chen et al. | |

* cited by examiner

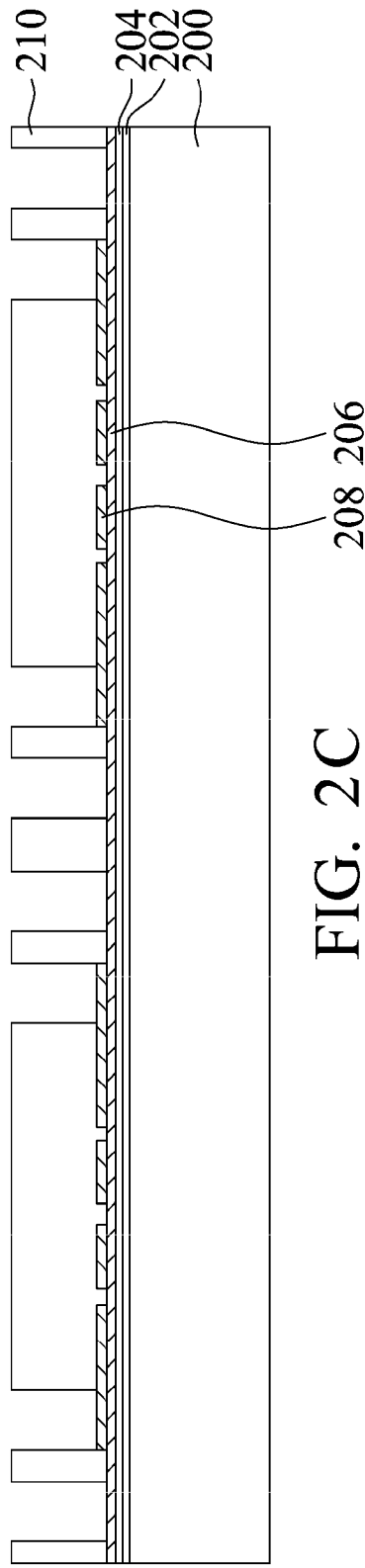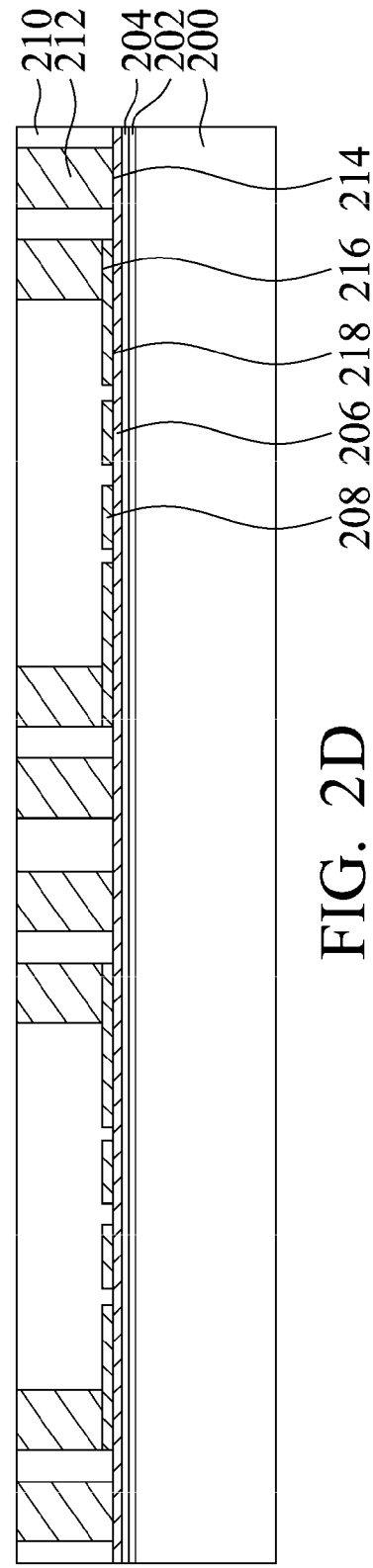

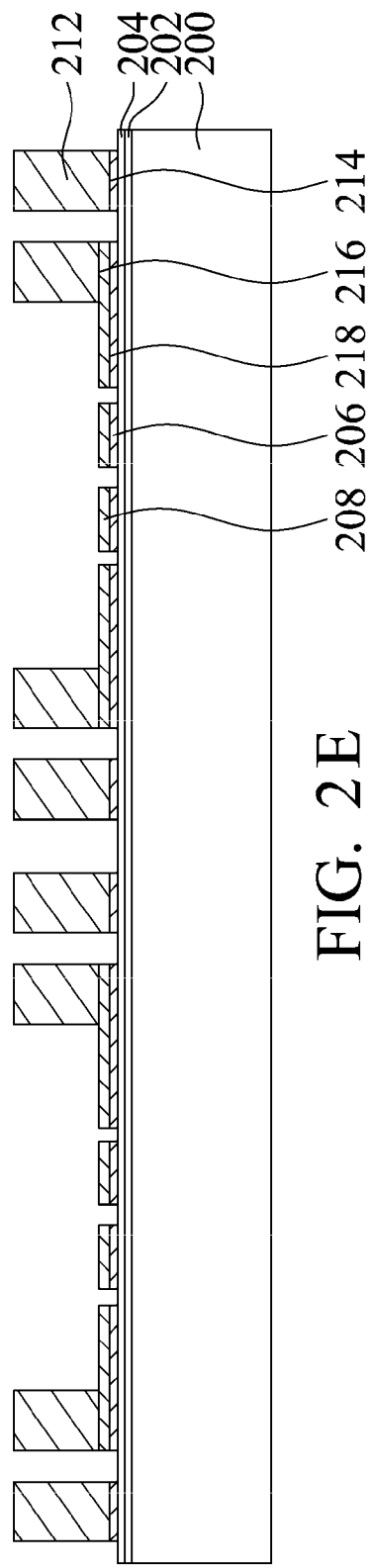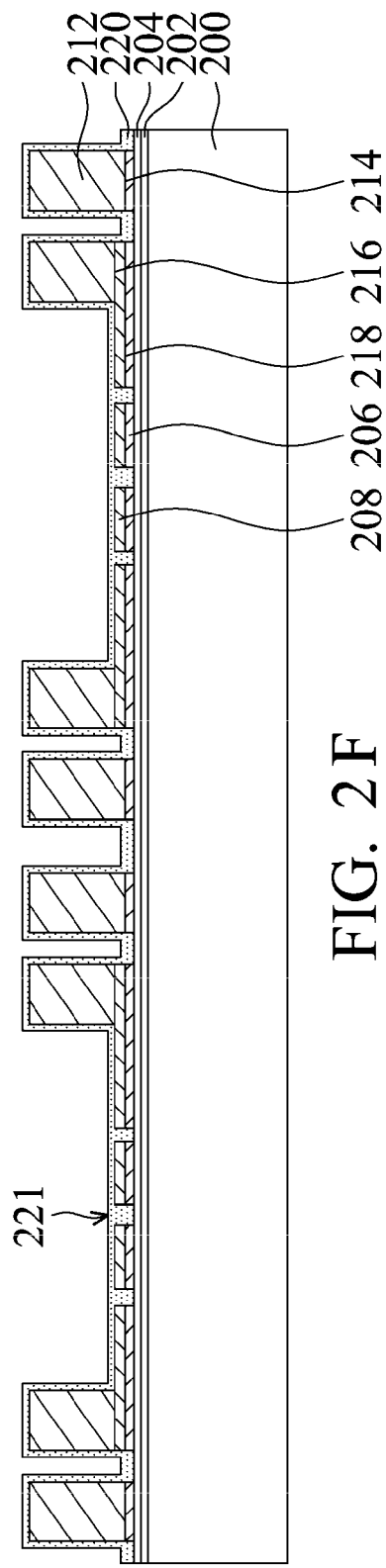

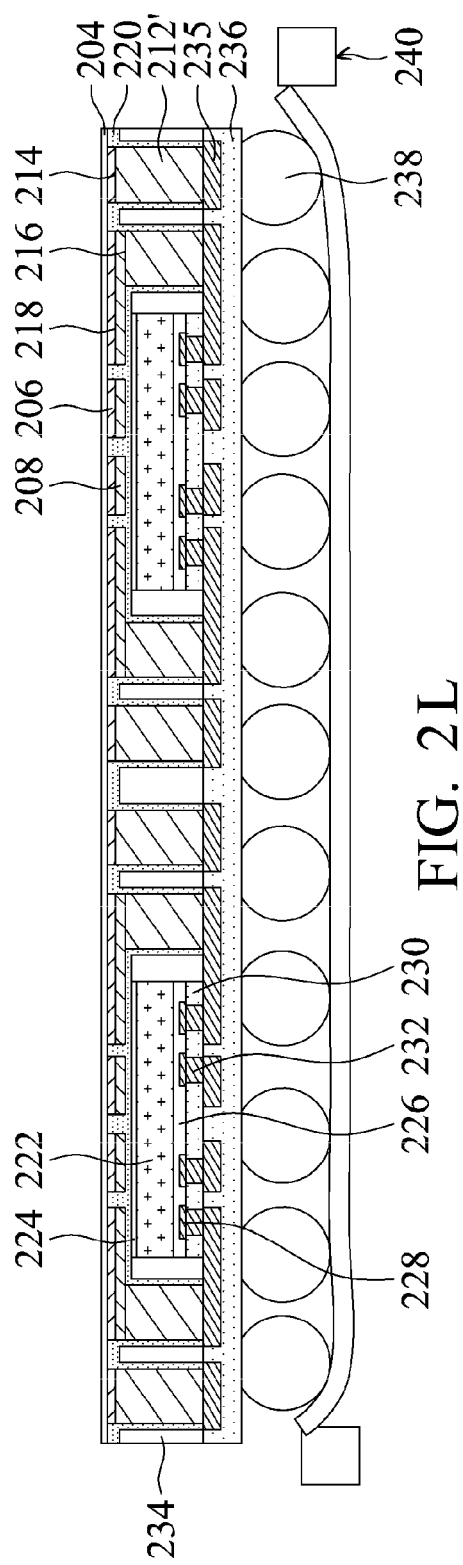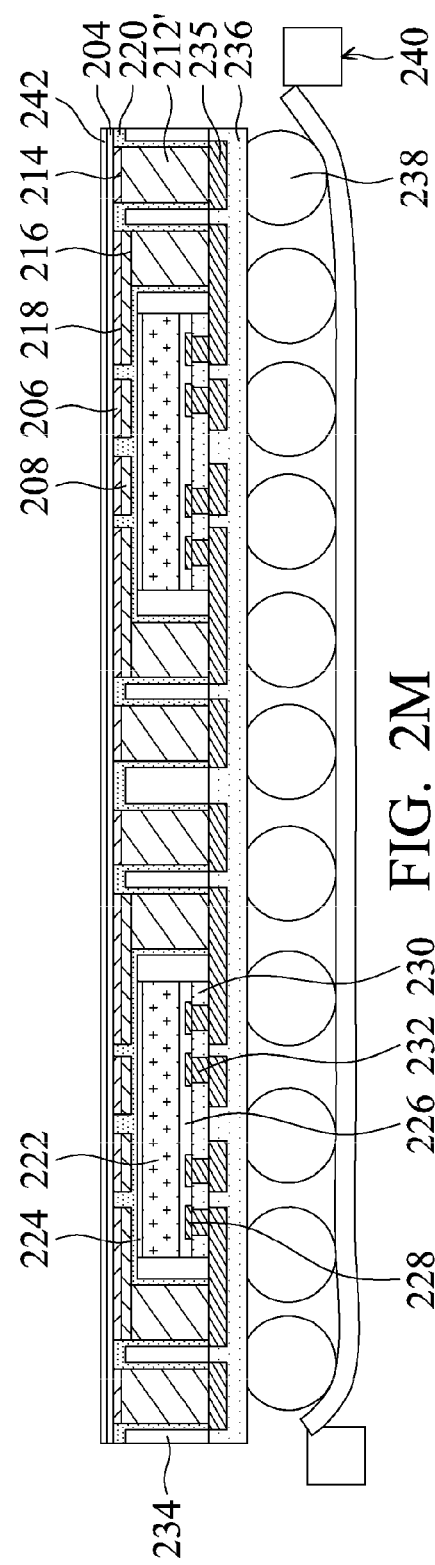

MECHANISMS FOR FORMING PACKAGE STRUCTURE

CROSS REFERENCE

This application is a Divisional of U.S. application Ser. No. 14/087,466, filed on Nov. 22, 2013, the entirety of which is incorporated by reference herein.

BACKGROUND

Semiconductor devices are used in a variety of electronic applications, such as personal computers, cell phones, digital cameras, or other electronic equipment. The semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies, such as package on package (PoP), have begun to be developed, in which a top package with a device die is bonded to a bottom package, with another device die. By adopting the new packaging technologies, various packages with different or similar functions are integrated together. These relatively new types of packaging technologies for semiconductor devices face manufacturing challenges.

BRIEF DESCRIPTION OF THE DRAWINGS

For a more complete understanding of various embodiments, and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Figure 1A:
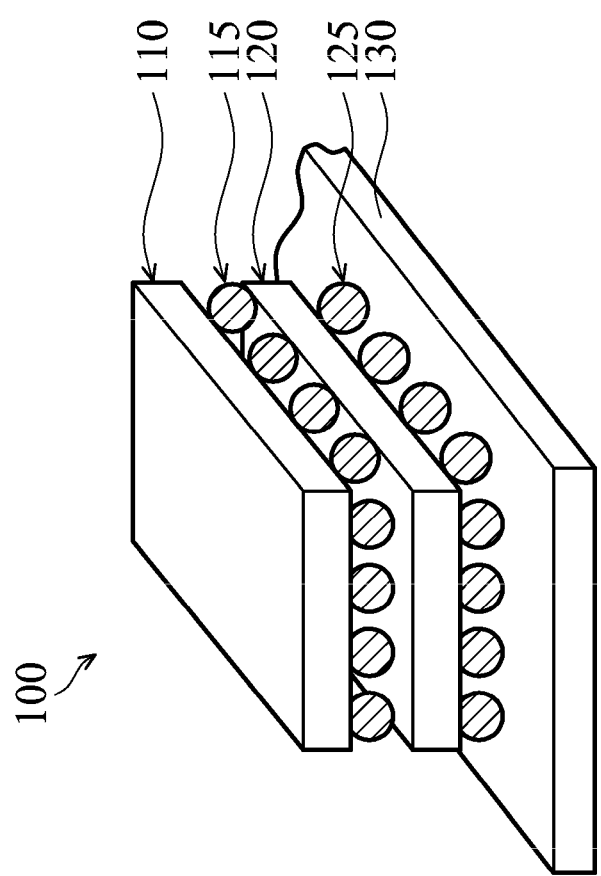
FIG. 1A is a perspective view of a package structure, in accordance with some embodiments.

FIG. 1A shows a perspective view of a package structure 100 having a die package 110 bonded to another die package 120, which is further bonded to a substrate 130, in accordance with some embodiments. The die package 110 is bonded to the die package 120 via bonding structures 115, and the die package 120 is bonded to the substrate 130 via bonding structures 125. Each die package, such as the die package 110 or the die package 120, includes one or more semiconductor dies. The semiconductor die includes a semiconductor substrate as used in semiconductor integrated circuit fabrication, and integrated circuits may be formed in and/or on the semiconductor substrate. In various embodiments, the semiconductor substrate includes constructions having semiconductor materials, such as a bulk silicon, a semiconductor wafer, a silicon-on-insulator (SOI) substrate, a silicon germanium substrate, etc. Other semiconductor materials including group III, group IV, and group V elements may also be used.

The semiconductor substrate may further include isolation features (not shown), such as shallow trench isolation (STI) features or local oxidation of silicon (LOCOS) features. The isolation features may define and isolate various device elements formed in the semiconductor substrate. Examples of the various device elements include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), diodes, or other suitable elements. Various processes are performed to form the various device elements including deposition, etching, implantation, photolithography, annealing, and/or other suitable processes. The device elements are interconnected to form the integrated circuit device, such as a logic device, memory device (e.g., static random access memory, SRAM), radio frequency (RF) device, input/output (I/O) device, system-on-chip (SoC) device, combinations thereof, or other applicable types of devices.

The substrate 130 may be a semiconductor wafer, or a portion of a wafer. In some embodiments, the substrate 130 includes silicon, gallium arsenide, silicon on insulator ("SOI"), or other suitable materials. In some embodiments, the substrate 130 also includes passive devices such as resistors, capacitors, inductors, and the like, or active devices such as transistors. In some embodiments, the substrate 130 includes additional integrated circuits. The substrate 130 may further include through substrate vias (TSVs) and may be an interposer.

Alternatively, the substrate 130 may be made of other materials. In some embodiments, the substrate 130 is a package substrate, such as a multiple-layer circuit board. In some embodiments, the package substrate also includes bismaleimide triazine (BT) resin, FR-4 (a composite material composed of woven fiberglass cloth with an epoxy resin binder that is flame resistant), ceramic, glass, plastic, tape, film, or other supporting materials that may carry conductive pads or lands used to receive conductive terminals.

In some embodiments, each of the bonding structures 115 between the die packages 110 and 120 is formed by using a ball-to-ball bonding process. Two solder balls formed on the die packages 110 and 120 are reflowed together to form one of the bonding structures 115. Similarly, the bonding structures 125 between the die package 120 and the substrate 130 may be formed by using the ball-to-ball bonding process described with reference to bonding structures 115.

Figure 1B:
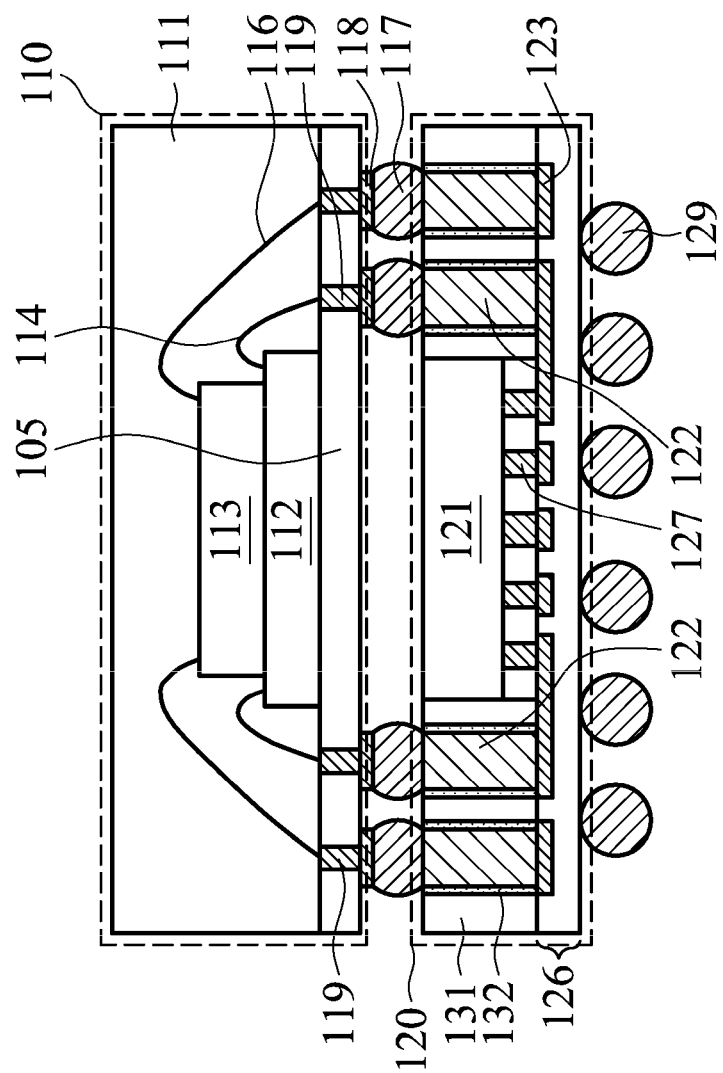
FIG. 1B is a cross-sectional view of two bonded die packages, in accordance with some embodiments.

FIG. 1B is a cross-sectional view of the die package 110 bonded with the die package 120, in accordance with some embodiments. As shown in FIG. 1B, the die package 110 includes two semiconductor dies 112 and 113, with the semiconductor die 113 over the semiconductor die 112. However, the die package 110 could include one semiconductor die or more than two semiconductor dies. In some embodiments, there is a glue layer (not shown) between the semiconductor dies 112 and 113. The semiconductor dies 112 and 113 may include various device elements, as described above for semiconductor dies. The semiconductor die 112 is bonded to a substrate 105. The substrate 105 may include various materials and/or components described above for the substrate 130.

The semiconductor die 112 is electrically and correspondingly connected to conductive elements 119 in the substrate 105 via bonding wires 114, in accordance with some embodiments. Similarly, the semiconductor die 113 is electrically and correspondingly connected to the conductive elements 119 in the substrate 105 via bonding wires 116. The die package 110 also includes a molding compound 111, which covers the semiconductor dies 112 and 113, and the bonding wires 114 and 116. A number of connectors 117 are formed over the bottom of the die package 110 for connections. The connectors 117 are formed on metal pads 118, which are electrically connected to bonding wires 114 and 116 by the conductive elements 119 of the die package 110. The connectors 117 and the metal pads 118 may be a portion of the bonding structures 115, as shown in FIG. 1A.

The die package 120 includes a semiconductor die 121 and through package vias (TPVs) 122 penetrating through a molding compound 131, as shown in FIG. 1B in accordance with some embodiments. The TPVs 122 surround the semiconductor die 121. The die package 120 also includes a redistribution structure 126, which includes one or more redistribution layers (RDLs) 123. The RDLs 123 are metal interconnect layers, which may include metal lines and vias, and are surrounded by dielectric material(s). The RDLs 123 enable fan-out of the semiconductor die 121. For example, the RDLs 123 electrically connect connectors 127 to the TPVs 122. Electrical connections to the semiconductor die 121 are laterally extended outside of the outline of the semiconductor die 121. The RDLs 123 may be distributed over an area larger than the die area of the semiconductor die 121. As shown in FIG. 1B, the RDLs 123 are distributed over the molding compound 131 and the TPVs 122.

Connectors 129, such as ball grid array (BGA), are attached to metal pads (not shown) on the redistribution structure 126, as shown in FIG. 1B. The connector 129 may be a portion of the bonding structures 125, as shown in FIG. 1A. As shown in FIG. 1B, the TPVs 122 are electrically connected to the connectors 117 of the die package 110. The semiconductor die 121 and the connectors 129 are on opposite sides of the redistribution structure 126. The semiconductor die 121 is electrically connected to the redistribution structure 126 via the connectors 127.

As shown in FIG. 1B, the TPVs 122 are encapsulated by the molding compound 131. An interfacial layer 132 is formed between the TPVs 122 and the molding compound 131, as shown in FIG. 1B in accordance with some embodiments. The interfacial layer 132 is configured to improve adhesion between the TPVs 122 and the molding compound 131. The interfacial layer 132 may include an insulating material such as a polymer material. In some embodiments, the polymer material includes polybenzoxazole (PBO), polyimide (PI), other suitable polymer materials, or combinations thereof. The interfacial layer 132 has good adhesion with both the molding compound 131 and the TPV 122. As a result, cracks may be prevented from being formed and propagating between the TPVs 122 and the molding compound 131. Because the crack is prevented from being formed, the RDLs 123 is also prevented from being broken and/or open by the crack, thus improving electrical-yield and reliability qualifications. In some other approaches, the interfacial layer 132 is not formed. As a result, in those approaches, cracks may be formed and propagate along the interface between the TPVs 122 and the molding compound 131 due to the coefficient of thermal expansion (CTE) mismatch between the TPVs 122 and the molding compound 131.

Figure 2A:
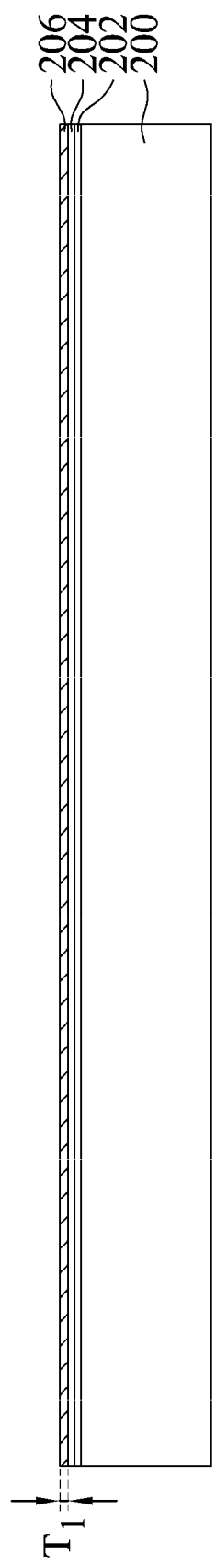
FIGS. 2A-2R are cross-sectional views of various stages of a process for forming a package structure, in accordance with some embodiments.

Embodiments of the disclosure have many variations. Some variations of the embodiments of the disclosure are described. FIGS. 2A-2R are cross-sectional views of various stages of a process for forming a package structure, in accordance with some embodiments.

As shown in FIG. 2A, an adhesive layer 202 and a base layer 204 are sequentially deposited or laminated over a carrier substrate 200, in accordance with some embodiments. The carrier substrate 200 is used as a temporary support substrate. The carrier substrate 200 may be made of a semiconductor material, ceramic material, polymer material, metal material, other suitable materials, or combinations thereof. In some embodiments, the carrier substrate 200 is a glass substrate. In some other embodiments, the carrier substrate 200 is a semiconductor substrate, such as a silicon wafer.

The adhesive layer 202 may be made of glue, or may be a lamination material, such as a foil. In some embodiments, the adhesive layer 202 is photosensitive and is easily detached from the carrier substrate 200 by shining ultraviolet (UV) light or laser light on the carrier substrate 200. For example, the adhesive layer 202 is a light-to-heat-conversion (LTHC) coating. In some other embodiments, the adhesive layer 202 is heat-sensitive. In some embodiments, the base layer 204 is a polymer layer. The base layer 204 may be a PBO layer, a PI layer, a solder resist (SR) layer, an ajinomoto buildup film (ABF), a die attach film (DAF), other applicable layers, or combinations thereof.

As shown in FIG. 2A, a seed layer 206 is deposited over the base layer 204, in accordance with some embodiments. In some embodiments, the seed layer 206 is made of copper and is deposited by physical vapor deposition (PVD). However, embodiments of the disclosure are not limited thereto. Other conductive films may also be used. For example, the seed layer 206 may be made of Ti, Ti alloy, Cu, Cu alloy, or combinations thereof. The Ti alloy or the Cu alloy may include silver, chromium, nickel, tin, gold, tungsten, other suitable materials, or combinations thereof.

The seed layer 206 has a thickness $T_1$. In some embodiments, the thickness $T_1$ is in a range from about 0.1 μm to about 0.6 μm. In some embodiments, a thinner seed layer 206 is formed. In some embodiments, a diffusion barrier layer (not shown) is deposited prior to the deposition of the seed layer 206. The diffusion barrier layer may be made of Ti or other suitable materials and have a thickness ranging from about 0.01 μm to about 0.2 μm. Alternatively, the diffusion barrier layer is made of other materials, such as TaN, or other applicable materials and the thickness range is not limited to the range described above. The diffusion barrier layer is deposited by PVD in some embodiments. In some embodiments, the diffusion barrier layer is not formed.

Figure 2B:
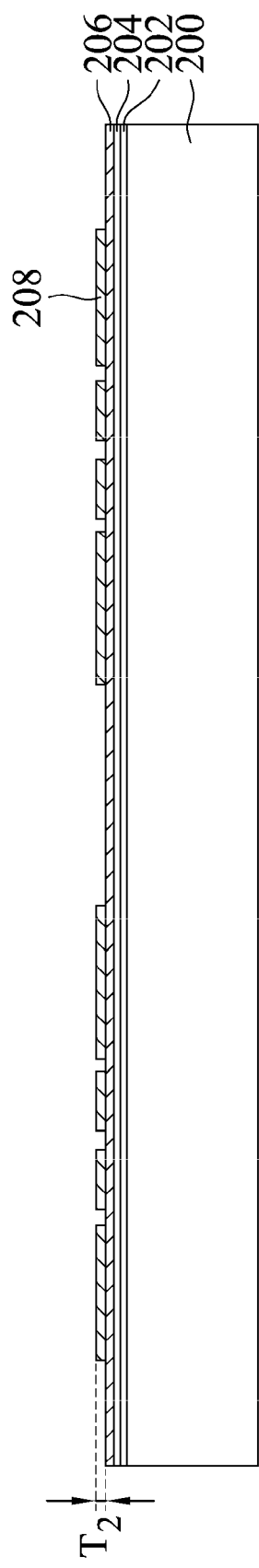

Following the deposition of the seed layer 206, a redistribution layer 208 is formed over the seed layer 206, as shown in FIG. 2B in accordance with some embodiments. The redistribution layer 208 may be made of Cu, Ni, Ti, other applicable materials, or combinations thereof. The redistribution layer 208 has a thickness T2 which is larger than the thickness T1 of the seed layer 206. In some embodiments, the thickness T2 is in a range from about 2 μm to about 12 μm. In some embodiments, the ratio of the thickness T1 to the thickness T2 (T1/T2) is in a range from about 0.8% to about 30%. The seed layer 206 may be considered a portion of the redistribution layer 208. Embodiments of the disclosure have many variations. In some other embodiments, the ratio of the thickness T1 to the thickness T2 (T1/T2) is in other suitable range, such as from about 0.5% to about 40%.

In some embodiments, the redistribution layer 208 is formed by electroplating. A photoresist layer (not shown) is deposited over the seed layer 206. Before the photoresist layer is deposited, the seed layer 206 may be cleaned to ensure that the deposited photoresist layer has a good adhesion with the seed layer 206. Therefore, the quality of subsequent patterning processes may be improved. The photoresist layer may be deposited by a wet process, such as a spin-on process, or by a dry process, such as by a dry film. Afterwards, the photoresist layer is patterned to form openings exposing the seed layer 206. The processes involved include photolithography and resist development processes. A descum process may also be performed. Then, one or more conductive materials are electroplated on the seed layer 206 exposed by the openings of the photoresist layer so as to completely or partially fill the opening and form the redistribution layer 208. Following the forming of the redistribution layer 208, the photoresist layer is stripped.

As shown in FIG. 2C, a mask layer 210 is formed over the seed layer 206 and the redistribution layer 208, in accordance with some embodiments. The mask layer 210 has openings exposing a portion of the redistribution layer 208. In some embodiments, the mask layer 210 also has openings exposing a portion of the seed layer 206. The openings of the mask layer 210 define the positions of through package vias which are subsequently formed. In some embodiments, the mask layer 210 is made of a photoresist material. The openings of the mask layer 210 may be formed by a photolithography process. The photolithography process may include exposure and development processes. In the development process, a suitable solution is applied on the mask layer 210 to partially remove the mask layer 210 such that the openings are formed. For example, the portion of the mask layer 210 irradiated with a suitable radiation (such as a UV light) during the exposure process is removed after the development process.

Following the forming of the mask layer 210, conductive columns 212 are formed to fill the openings of the mask layer 210, as shown in FIG. 2D in accordance with some embodiments. In some embodiments, a conductive material such as copper is electroplated over the seed layer 206 and the redistribution layer 208 to fill the openings of the mask layer 210 and form the conductive columns 212. The redistribution layer 208 over the seed layer 206 also functions as a plating seed layer. In these cases, no additional seed layer and passivation layer is formed over the redistribution layer 208 for forming the conductive columns 212. The conductive columns 212 are directly electroplated on the redistribution layer 208.

Some of the conductive columns 212 are above the seed layer 206 exposed by the openings of the mask layer 210. The conductive columns 212 may be in direct contact with the seed layer 206. An interface 214 is formed between the conductive column 212 and the seed layer 206. Some of the conductive columns 212 are above the redistribution layer 208 exposed by the openings of the mask layer 210. The conductive columns 212 may be in direct contact with the redistribution layer 208. An interface 216 is formed between the conductive column 212 and the redistribution layer 208. An interface 218 is formed between the seed layer 206 and the redistribution layer 208. There are two interfaces (the interfaces 216 and 218) between the conductive column 212 and the seed layer 206. In some embodiments, there are at most two interfaces formed between the conductive column 212 and the seed layer 206.

As shown in FIG. 2E, the mask layer 210 is removed. Afterwards, the portion of the seed layer 206, which is not covered by the redistribution layer 208 or the conductive columns 212, is subsequently removed, in accordance with some embodiments. An etching process may be used to partially remove the seed layer 206. After the etching process, a portion of the base layer 204 is exposed.

As shown in FIG. 2F, an interfacial layer 220 is deposited over the base layer 204, the conductive columns 212, the seed layer 206, and the redistribution layer 208, in accordance with some embodiments. In some embodiments, the interfacial layer 220 is continuous and has no separate portion. The interfacial layer 220 has good adhesion with the conductive columns 212 and a subsequently formed molding compound. In some embodiments, the interfacial layer 220 is made of an insulating material such as a polymer material. The interfacial layer 220 may be made of polybenzoxazole (PBO), polyimide (PI), other applicable material, or combinations thereof. In some other embodiments, the interfacial layer 220 is made of an oxide material, a nitride material, an oxynitride material, or combinations thereof.

The interfacial layer 220 may be deposited by using a suitable process, such as a spin coating process, vapor deposition polymerization (VDP) process, vapor deposition process, or the like. In some embodiments, the interfacial layer 220 conformally covers sidewalls and top portions of the conductive columns 212. In some embodiments, the interfacial layer 220 includes planar portions 221 which are over the redistribution layer 208 and between the conductive columns 212. Each of the planar portions 222 has a substantially planar top surface.

Figure 2G:
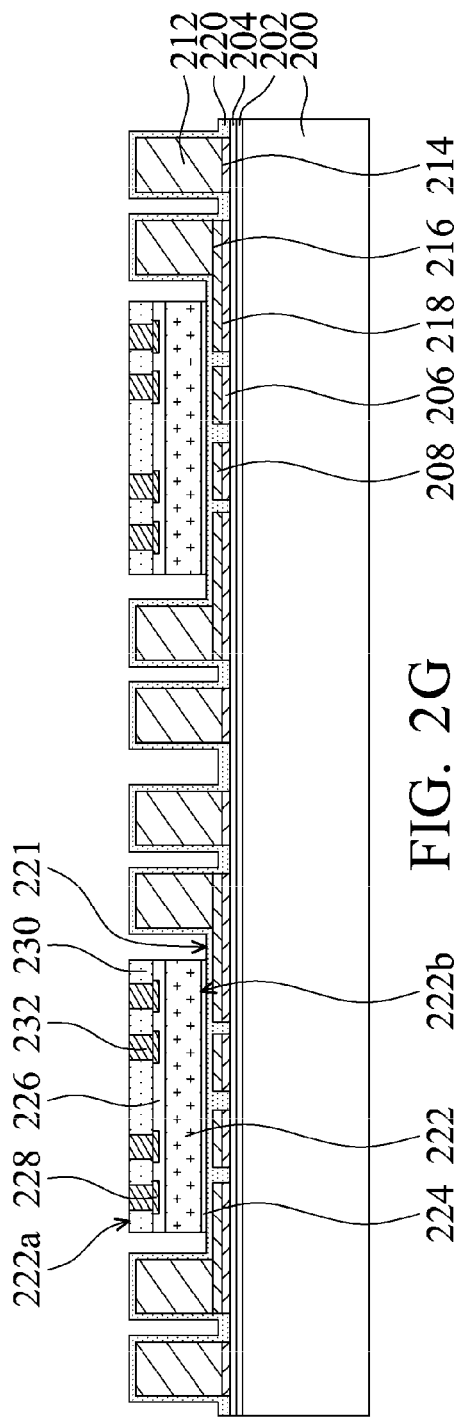

As shown in FIG. 2G, semiconductor dies 222 are attached to the planar portions 221 of the interfacial layer 220 by a glue layer 224, in accordance with some embodiments. In some embodiments, the back sides 222b of the semiconductor dies 222 face the planar portions 221 with the front sides 222a of the semiconductor dies 222 facing upwards. Each of the semiconductor dies 222 may include a passivation layer 226, conductive pads 228, a protection layer 230, and connectors 232 at the front side 222a of the semiconductor die 222. In some embodiments, the back sides 222b of the semiconductor dies 222 are substantially parallel to the planar portions 221. Therefore, the connectors 232 could be positioned at the same level or at the same height. Top terminals of the connectors 232 may be substantially at the same horizontal plane. In some embodiments, it is easier to form subsequent contact elements, such as a redistribution layer, over the connectors 232 with substantially the same height.

The glue layer 224 may be in direct contact with the back sides 222b of the semiconductor dies 222 and the planar portions 221. The glue layer 224 is made of a die attach film (DAF), in accordance with some embodiments. The DAF may be made of epoxy resin, phenol resin, acrylic rubber, silica filler, the like, or combinations thereof. In some embodiments, the interfacial layer 220 is adhesive. In these cases, the glue layer 224 is not used. The semiconductor dies 222 are directly disposed and fixed on the planar portion 221 of the interfacial layer 220.

Figure 2H:
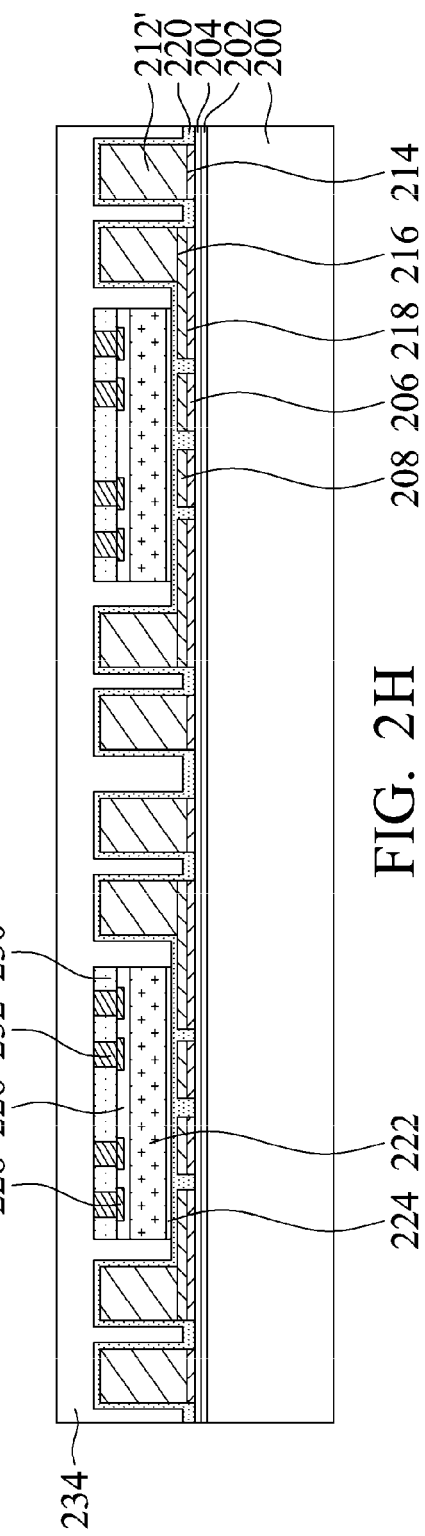

As shown in FIG. 2H, a molding compound 234 is formed over the structure shown in FIG. 2G, in accordance with some embodiments. The molding compound 234 fills the space between the conductive columns 212 and partially or completely encapsulates the semiconductor dies 222. In some embodiments, a liquid molding compound material is applied over the interfacial layer 220 and the semiconductor dies 222 to encapsulate the conductive columns 212 and the semiconductor dies 222. A thermal process is then applied to harden the molding compound material and to transform it into the molding compound 234. The conductive columns 212 now become through package vias (TPVs) 212'. In some embodiments, the TPVs 212' surround the semiconductor dies 222.

As shown in FIG. 2H, the interfacial layer 220 is between the molding compound 234 and the TPVs 212'. The interfacial layer 220 has high adhesion with both the TPVs 212' and the molding compound 234. In some embodiments, the interfacial layer 220 is in direct contact with the molding compound 234. There is substantially no void or gap formed between the molding compound 234 and the interfacial layer 220. The upper surface of the interfacial layer 220, as a whole, may be in direct contact with the molding compound 234. In some embodiments, the molding compound 234 is completely separated from the TPVs 212' by the interfacial layer 220. Because the interfacial layer 220 has good adhesion with the molding compound 234 and the TPVs 212', there is substantially no crack formed between the molding compound 234 and the TPVs 212'. The cracking problems, such as those described in FIG. 1B, are significantly reduced or resolved.

Figure 2I:
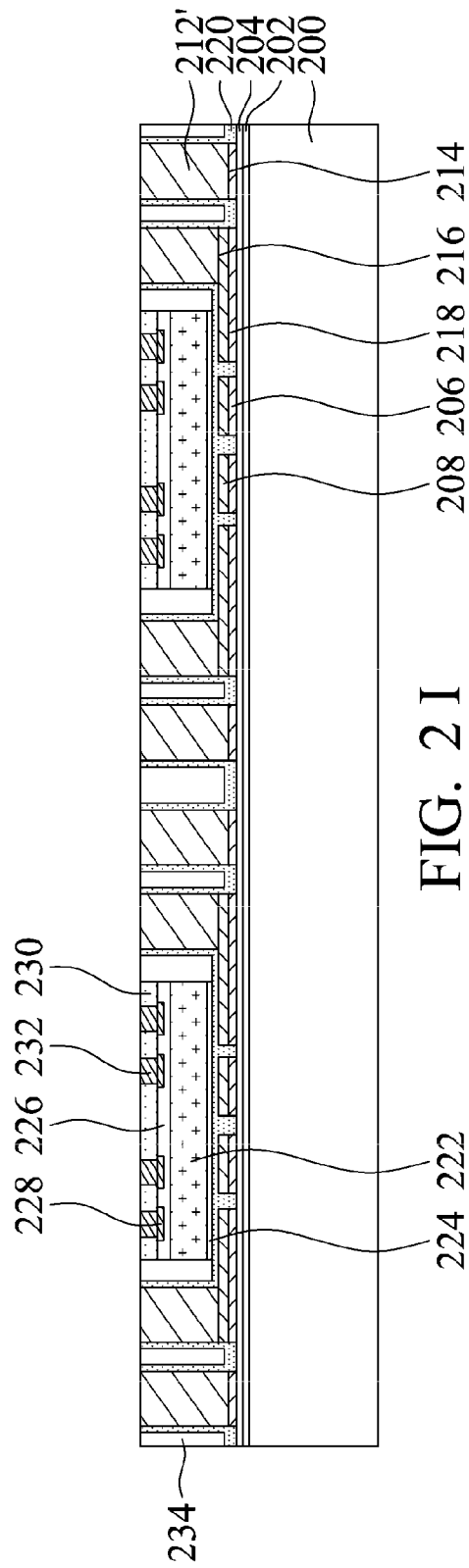

Following the forming of the molding compound 234, the molding compound 234 is thinned down to expose the TPVs 212' and the connectors 232 of the semiconductor dies 222, as shown in FIG. 2I in accordance with some embodiments. A grinding process or the like may be performed to thin the molding compound 234. In some embodiments, a portion of the interfacial layer 220 over the tops of the TPVs 212' are also removed during the grinding process. In some embodiments, a metal recess process is performed to remove residues on the TPVs 212' and the connectors 232. The residues may come from the molding compound 234. The metal recess process may be achieved by using an etching process or the like. However, in some other embodiments, the metal recess process is not performed.

Figure 2J:
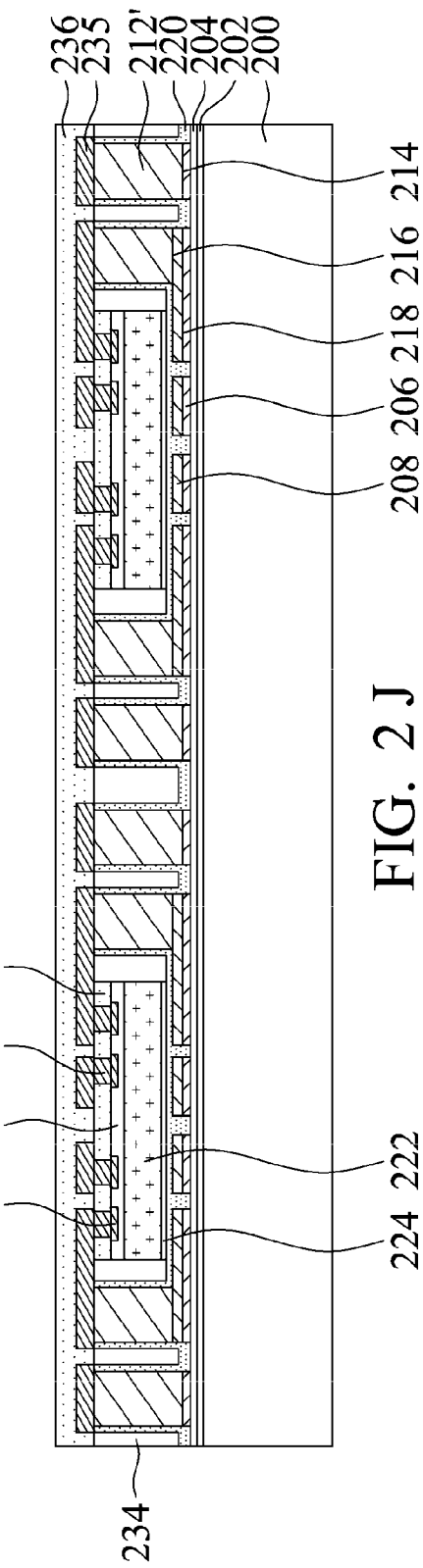

Afterwards, a redistribution structure including a redistribution layer 235 and a passivation layer 236 are formed over the structure shown in FIG. 2I, as shown in FIG. 2J in accordance with some embodiments. The redistribution layer 235 forms multiple electrical connections to the TPVs 212' and to the connectors 232. For example, a portion of the redistribution layer 235 is electrically connected to one of the conductive pads 228 through one of the connectors 232. A portion of the redistribution layer 235 electrically connects one of the connectors 232 to one of the TPVs 212'. A portion of the redistribution layer 235 is electrically connected to one of the TPVs 212'. The pattern of the redistribution layer 235 can be adjusted according to some specifications. For example, if a different circuit layout is used to establish the connections between the TPVs 212' and the conductive pads 228, the pattern of the redistribution layer 235 may be varied accordingly. The material and the forming method of the redistribution layer 235 may be similar to those of the redistribution layer 208.

Due to the high adhesion between the TPVs 212' and the molding compound 234 provided by the interfacial layer 220, there is substantially no crack formed between the TPVs 212' and the molding compound 234. As a result, the redistribution layer 235 is prevented from being damaged since the cracking problem is reduced. Quality and reliability of the redistribution layer 235 are therefore improved.

The passivation layer 236 may include one or more layers. The passivation layer 236 may have openings (not shown) exposing portions of the redistribution layer 235. Bond pads (not shown) may be formed over the exposed redistribution layer 235. The passivation layer 236 is made of dielectric material(s) and provides stress relief for bonding stress incurred during subsequent bonding processes. In some embodiments, the passivation layer 236 is made of polymers, such as polyimide, PBO, the like, or combinations thereof. Alternatively or additionally, the passivation layer 236 may include benzocyclobutene (BCB).

Figure 2K:
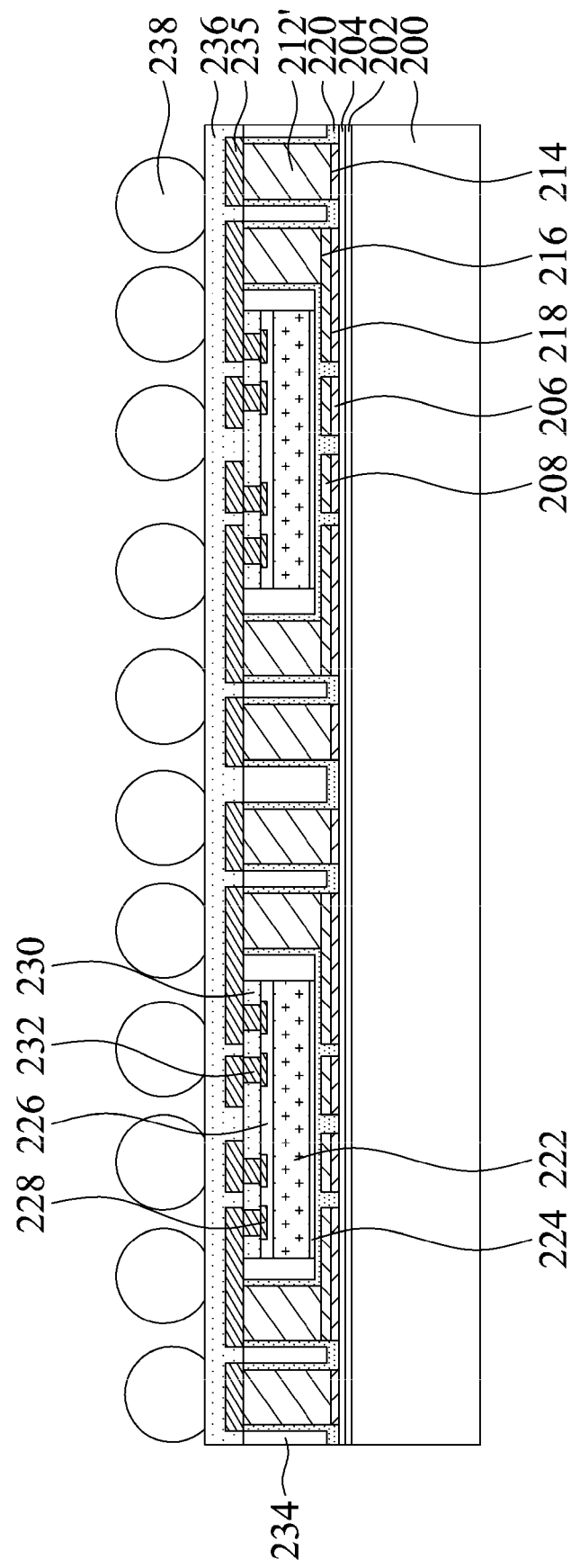

As shown in FIG. 2K, connectors 238 are formed over the passivation layer 236, in accordance with some embodiments. The connectors 238 may be mounted on (or bonded to) bond pads (not shown) of the redistribution structure through the openings (not shown) of the passivation layer 236. Some of the connectors 238 are electrically connected to one of the semiconductor dies 222 through the redistribution layer 235. Some of the connectors 238 are electrically connected to other elements through the redistribution layer 235 and one of the TPVs 212'. The connectors 238 may include solder bumps. An under bump metallurgy (UBM) layer (not shown) may be formed below the connectors 238.

After the connectors 238 are formed, the structure shown in FIG. 2K is flipped and attached to a carrier 240 and the carrier substrate 200 is removed, as shown in FIG. 2L in accordance with some embodiments. The carrier 240 includes a tape which is photosensitive or heat-sensitive and is easily detached from the connectors 238. Both the carrier substrate 200 and the adhesive layer 202 are removed. Suitable light may be provided to remove the adhesive layer 202 so as to remove the carrier substrate 200 as well.

As shown in FIG. 2M, a protection film 242 is attached over the base layer 204, in accordance with some embodiments. After the carrier substrate 200 is removed, warpage of the structure shown in 2L may occur. The protection film 242 may be used to prevent the warpage such that subsequent packaging processes can be performed smoothly. The protection film 242 may include a solder resist film, an ajinomoto buildup film (ABF), backside laminating film (such as a chip backside coating tape), or other suitable films. However, in some other embodiments, the protection film 242 is not formed.

Figure 2N:
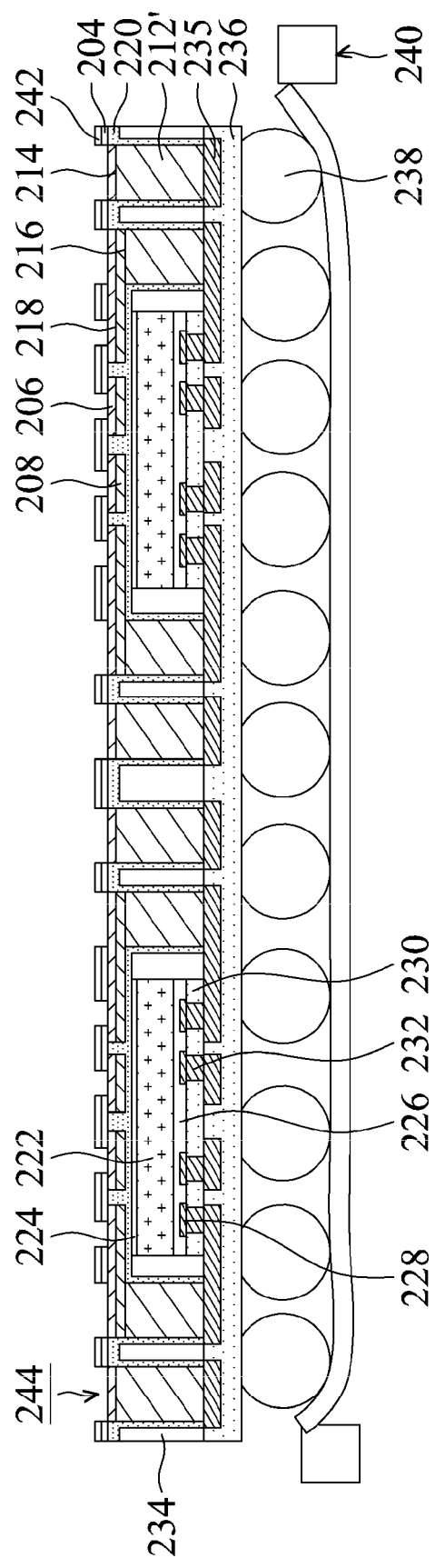

As shown in FIG. 2N, a portion of the protection film 242 and the base layer 204 are removed to form openings 244 exposing the redistribution layer, such as the seed layer 206, in accordance with some embodiments. In some embodiments, a laser drill process is performed to form the openings 244. Other suitable processes, such as an etching process, may also be used to form the openings.

After the openings 244 are formed, an etching process is performed to remove an upper portion of the exposed seed layer 206, in accordance with some embodiments. In some embodiments, the seed layer 206 includes multiple layers such as a Cu layer and a Ti layer. The etching process mentioned above is used to partially remove the Ti layer such that the Cu layer is exposed. However, in some other embodiments, the etching process mentioned above is not performed.

Figure 2O:
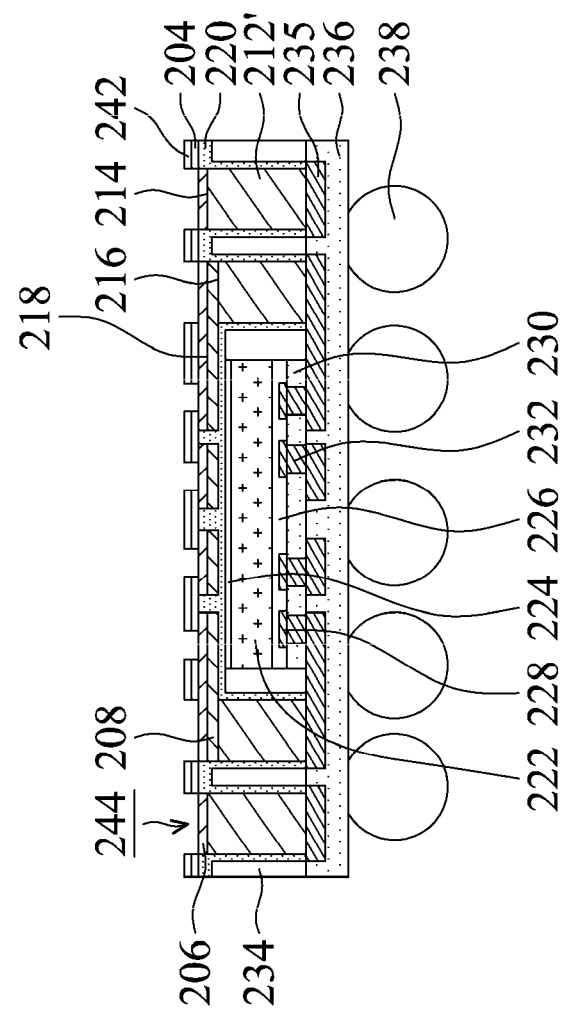

Afterwards, a dicing process is performed to form a number of die packages separated from each other, and one of the die packages is shown in FIG. 2O, in accordance with some embodiments. The carrier 240 may also be removed. In some embodiments, a solder paste, a flux, an organic solderability preservative (OSP) layer, or the like is formed over the exposed seed layer 206 for pad protection.

Figure 2P:
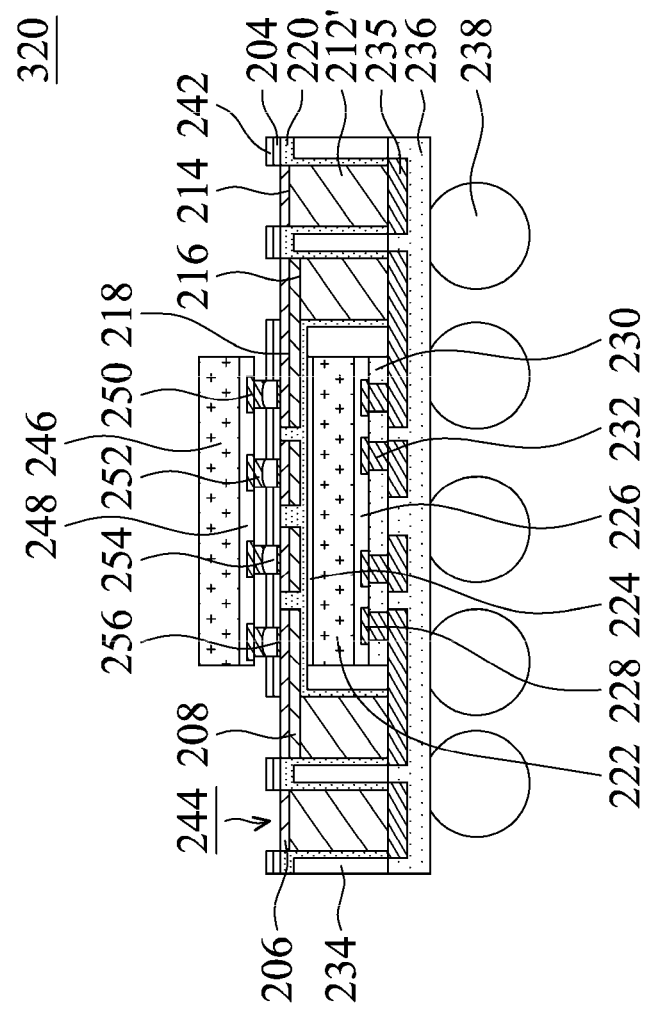

As shown in FIG. 2P, a semiconductor die 246 is stacked over the structure shown in FIG. 2O to form a die package 320 (or a package structure), in accordance with some embodiments. The semiconductor die 246 includes a passivation layer 248, conductive pads 250, and connectors 252. In some embodiments, the connectors 252 are conductive pillars, such as Cu pillars. The semiconductor die 246 may be bonded to the seed layer 206 through a solder material 254. A reflow process may be performed to achieve the bonding. An inter-metal compound (IMC) 256 is formed between the solder material 254 and the seed layer 206 in some embodiments.

Figure 2Q:
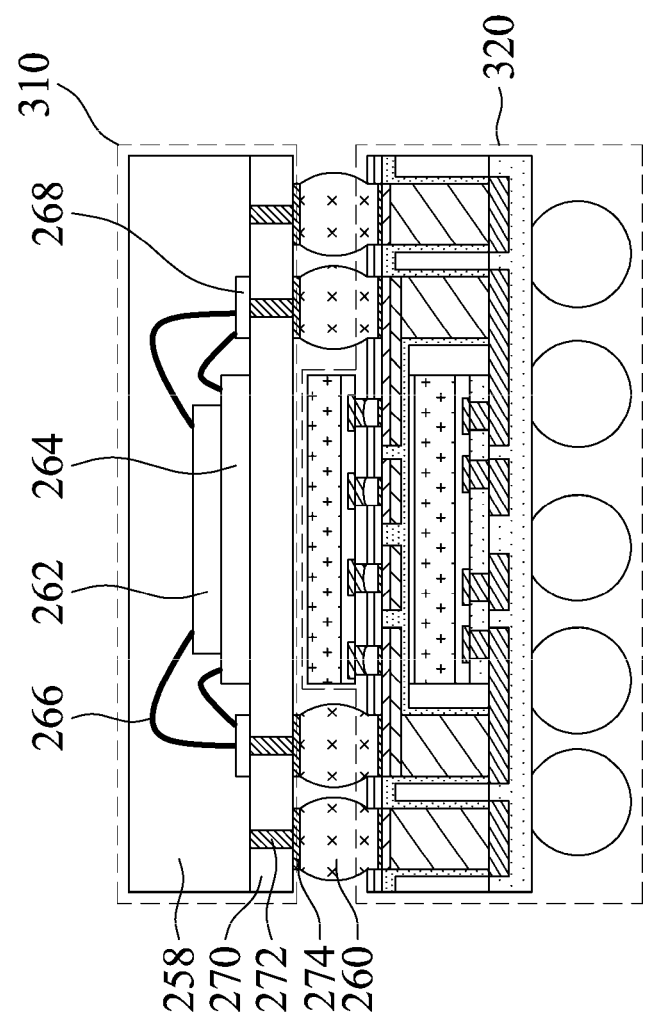
Figure 2R:
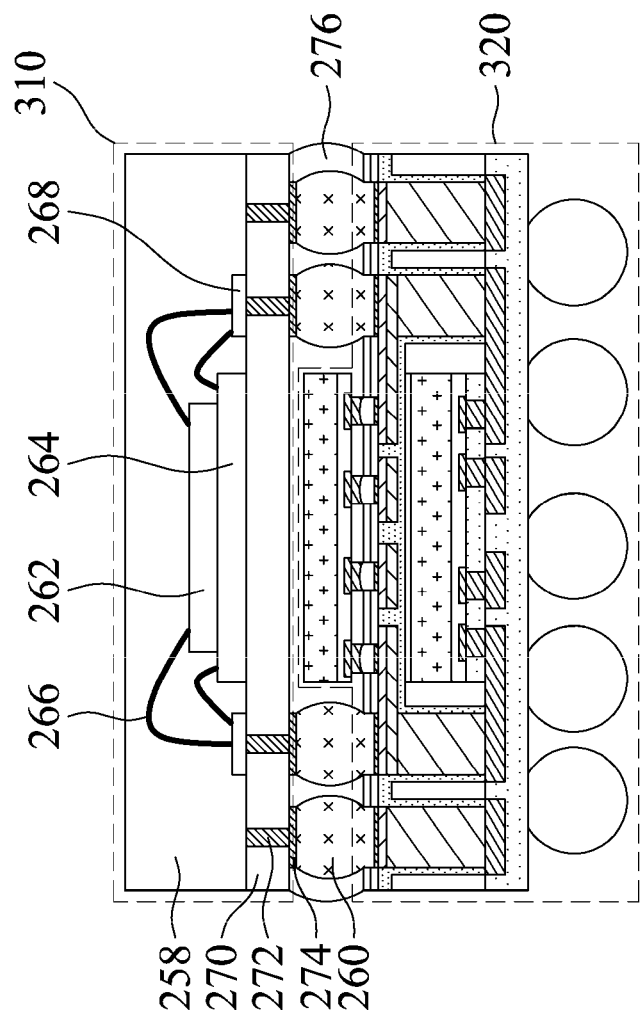

As shown in FIG. 2Q, a die package 310 is bonded to the die package 320, in accordance with some embodiments. The die package 310 may be similar to the die package 110 shown in FIG. 1B. The die package 310 includes two semiconductor dies 262 and 264, with the semiconductor die 262 over the semiconductor die 264. The semiconductor dies 262 and 264 may include various device elements, as described above for semiconductor dies. In some embodiments, the semiconductor dies 262 and 264 are DRAM dies. The semiconductor die 264 is bonded to a substrate 270, which is similar to the substrate 105 shown in FIG. 1B.

The semiconductor dies 262 and 264 are electrically and correspondingly connected to conductive elements 272 in the substrate 270 via bonding wires 266 and conductive elements 268, in accordance with some embodiments. The die package 310 also includes a molding compound 258, which covers the semiconductor dies 262 and 264, and also the bonding wires 266. A number of connectors 260 may be formed between the die packages 310 and 320 for connections. The connectors 260 are formed on metal pads 274. The connectors 260 include solder bumps which are formed by using a reflow process.

As shown in FIG. 2R, an underfill 276 is filled between the die packages 310 and 320, in accordance with some embodiments. The underfill 276 may be made of a resin material and be used to protect the connectors 260.

In accordance with some embodiments, a package structure and a method for forming a package structure are provided. The package structure includes through package vias penetrating through a molding compound which encapsulate one or more semiconductor dies. An interfacial layer is formed between the molding compound and the through package vias to ensure that substantially no crack is formed between the molding compound and the through package vias. Therefore, the performance and reliability of the package structure are significantly improved.

In accordance with some embodiments, a package structure is provided. The package structure includes a semiconductor die and a molding compound partially or completely encapsulating the semiconductor die. The package structure also includes a through package via in the molding compound. The package structure further includes an interfacial layer between the through package via and the molding compound. The interfacial layer includes an insulating material and is in direct contact with the molding compound.

In accordance with some embodiments, a package structure is provided. The package structure includes a semiconductor die and a molding compound at least partially encapsulating the semiconductor die. The package structure also includes a number of through package vias in the molding compound. The package structure further includes an interfacial layer between the through package vias and the molding compound. The interfacial layer includes a polymer material and is in direct contact with the molding compound.

In accordance with some embodiments, a method for forming a package structure is provided. The method includes forming a base layer, a redistribution layer, and a plurality of conductive columns over a carrier substrate. The method also includes depositing an interfacial layer over sidewalls of the conductive columns and disposing a semiconductor die over the redistribution layer. The interfacial layer comprises an insulating material. The method further includes forming a molding compound to partially or completely encapsulate the semiconductor die, the conductive columns, and the interfacial layer. The molding compound is in direct contact with the interfacial layer. In addition, the method includes forming a second redistribution layer over the conductive columns and the semiconductor die and removing the carrier substrate.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a package structure, comprising:
    forming a base layer, a redistribution layer, and a plurality of conductive columns over a carrier substrate, wherein the base layer is an insulating layer;
    depositing an interfacial layer over sidewalls of the conductive columns, wherein the interfacial layer comprises an insulating material;
    disposing a semiconductor die over the redistribution layer;
    forming a molding compound to at least partially encapsulate the semiconductor die, the conductive columns, and the interfacial layer, wherein the molding compound is in direct contact with the interfacial layer;
forming a second redistribution layer over the conductive columns and the semiconductor die; and
removing the carrier substrate.

2. The method for forming a package structure as claimed in claim 1, wherein the conductive columns are directly electroplated on the redistribution layer.

3. The method for forming a package structure as claimed in claim 1, further comprising:
removing a portion of the base layer to expose a portion of the redistribution layer; and
stacking a second semiconductor die over the redistribution layer through connectors formed between the second semiconductor die and the redistribution layer.

4. The method for forming a package structure as claimed in claim 3, further comprising bonding a die package to the redistribution layer through connectors formed between the die package and the redistribution layer after the second semiconductor die is stacked.

5. The method for forming a package structure as claimed in claim 1, further comprising grinding the molding compound to expose the conductive columns before the second redistribution layer is formed over the conductive columns and the semiconductor die.

6. The method for forming a package structure as claimed in claim 1, wherein the interfacial layer is conformally deposited on the sidewalls of the conductive columns.

7. The method for forming a package structure as claimed in claim 1, wherein the interfacial layer is also deposited on the redistribution layer to form a planar portion of the interfacial layer on the redistribution layer, and the semiconductor die is disposed on the interfacial layer.

8. The method for forming a package structure as claimed in claim 1, wherein the interfacial layer comprises polybenzoxazole (PBO), polyimide (PI), or a combination thereof.

9. The method for forming a package structure as claimed in claim 1, further comprising:
forming a mask layer over the redistribution layer before forming the conductive columns, wherein the mask layer has openings exposing portions of the redistribution layer;
forming the conductive columns in the openings of the mask layer by electroplating; and
removing the mask layer.

10. The method for forming a package structure as claimed in claim 1, wherein the interfacial layer is directly deposited on the conductive columns.

11. A method for forming a package structure, comprising:
forming a base layer, a redistribution layer, and a plurality of conductive columns over a carrier substrate, wherein the base layer is an insulating layer;
forming an interfacial layer over sidewalls of the conductive columns and the redistribution layer, wherein the interfacial layer is made of an insulating material;
disposing a semiconductor die over the redistribution layer; and
forming a molding compound to at least partially encapsulate the semiconductor die, the conductive columns, and the interfacial layer such that the molding compound is in direct contact with the interfacial layer.

12. The method for forming a package structure as claimed in claim 11, further comprising forming a second redistribution layer over the conductive columns and the semiconductor die.

13. The method for forming a package structure as claimed in claim 12, further comprising removing a portion of the molding compound and a portion of the interfacial layer to expose the conductive columns before the second redistribution layer is formed over the conductive columns and the semiconductor die.

14. The method for forming a package structure as claimed in claim 11, further comprising:
removing a portion of the base layer to expose a portion of the redistribution layer; and
stacking a second semiconductor die over the redistribution layer through connectors formed between the second semiconductor die and the redistribution layer.

15. The method for forming a package structure as claimed in claim 14, further comprising removing the carrier substrate before the stacking of the second semiconductor die.

16. A method for forming a package structure, comprising:
forming a base layer and a plurality of conductive columns over a carrier substrate, wherein the base layer is an insulating layer;
forming an interfacial layer over sidewalls and tops of the conductive columns, wherein the interfacial layer is made of an insulating material;
disposing a semiconductor die over a planar portion of the interfacial layer; and
forming a molding compound to at least partially encapsulate the semiconductor die, the conductive columns, and the interfacial layer such that the molding compound is in direct contact with the interfacial layer.

17. The method for forming a package structure as claimed in claim 16, wherein the interfacial layer is directly formed on the conductive columns.

18. The method for forming a package structure as claimed in claim 16, wherein the interfacial layer includes a polymer material.

19. The method for forming a package structure as claimed in claim 16, further comprising:
removing the carrier substrate; and
stacking a second semiconductor die over a backside of the semiconductor die after the removal of the carrier substrate such that the semiconductor die is electrically connected to one of the conductive columns.

20. The method for forming a package structure as claimed in claim 19, further comprising removing a portion of the molding compound and a portion of the interfacial layer after the removal of the carrier substrate and before the stacking of the second semiconductor die.

* * * * *